(12) United States Patent
Barreau et al.

(10) Patent No.: US 7,599,172 B2
(45) Date of Patent: Oct. 6, 2009

(54) ELECTRONIC SPEED CONTROLLER WITH MODULAR LAYOUT

(75) Inventors: Jérôme Barreau, Courdimanche (FR); Thierry Huin, Garenne s/Eure (FR)

(73) Assignee: Schneider Toshiba Inverter Europe SAS, Pacy sur Eure (FR)

( * ) Notice: Subject to any disclaimer, the term of this patent is extended or adjusted under 35 U.S.C. 154(b) by 644 days.

(21) Appl. No.: 11/114,031

(22) Filed: Apr. 26, 2005

(65) Prior Publication Data
US 2005/0251270 A1 Nov. 10, 2005

(30) Foreign Application Priority Data
May 4, 2004 (FR) .................................. 04 04723

(51) Int. Cl.
*H02B 1/26* (2006.01)
(52) U.S. Cl. .................... 361/657; 361/622; 361/624; 361/641; 361/643; 361/658; 361/679.01; 361/735
(58) Field of Classification Search ............... 361/679, 361/681, 735, 728, 729, 730, 731, 733, 622, 361/623, 641, 643, 624, 657, 658, 679.01
See application file for complete search history.

(56) References Cited

U.S. PATENT DOCUMENTS

| | | | | | |
|---|---|---|---|---|---|
| 3,633,075 | A | * | 1/1972 | Hawkins ..................... | 361/616 |
| 4,401,351 | A | * | 8/1983 | Record ......................... | 439/61 |
| 4,516,664 | A | * | 5/1985 | Anzai et al. .................. | 187/296 |
| 4,530,066 | A | * | 7/1985 | Ohwaki et al. ............... | 361/724 |
| 4,609,857 | A | * | 9/1986 | Ishii ............................ | 318/696 |
| 4,680,674 | A | * | 7/1987 | Moore ......................... | 361/686 |
| 4,853,838 | A | * | 8/1989 | Westermann ................ | 700/84 |
| 4,893,263 | A | * | 1/1990 | Myers ......................... | 361/684 |
| 4,964,018 | A | * | 10/1990 | Mallory et al. .............. | 361/725 |
| 5,097,388 | A | * | 3/1992 | Buist et al. .................. | 361/686 |
| 5,157,585 | A | * | 10/1992 | Myers ......................... | 361/680 |
| 5,247,285 | A | * | 9/1993 | Yokota et al. ............... | 361/680 |
| 5,430,607 | A | * | 7/1995 | Smith ......................... | 361/683 |
| 5,528,453 | A | * | 6/1996 | Berman et al. .............. | 361/625 |
| 5,552,965 | A | | 9/1996 | Habegger | |
| 5,636,101 | A | * | 6/1997 | Bonsall et al. .............. | 361/681 |
| 5,949,644 | A | * | 9/1999 | Park .......................... | 361/686 |

(Continued)

FOREIGN PATENT DOCUMENTS

EP 0 660 652 A1 6/1995

*Primary Examiner*—Jayprakash N Gandhi
*Assistant Examiner*—Quinn Hunter
(74) *Attorney, Agent, or Firm*—Oblon, Spivak, McClelland, Maier & Neustadt, L.L.P.

(57) ABSTRACT

An electronic speed controller including a cabinet, a display and dialogue module, and a control bus connector. The cabinet includes an electronic control/command assembly. The display and dialogue module is disposed at a front face of the cabinet and includes a communication connector linked at the rear of the display and dialogue module to the electronic control/command assembly. The control bus connector links the communication connector and the electronic control/command assembly. The cabinet supports either (i) the display and dialogue module directly connected by a rear connector to the control bus connector or (2) one option module including a through connector with a rear part directly connected to the control bus connector and a front part directly connected to either the rear connector of the display and dialogue module or a rear part of a through connector of another option module.

20 Claims, 3 Drawing Sheets

U.S. PATENT DOCUMENTS

| | | | |
|---|---|---|---|
| 6,229,584 B1 * | 5/2001 | Chuo et al. | 349/58 |
| 6,275,946 B1 * | 8/2001 | Meir | 713/300 |
| 6,430,634 B1 * | 8/2002 | Mito | 710/100 |
| 6,469,858 B1 * | 10/2002 | Tsuyuguchi | 360/73.03 |
| 6,480,374 B1 * | 11/2002 | Lee | 361/681 |
| 6,493,230 B2 * | 12/2002 | Clidaras et al. | 361/730 |
| 6,795,318 B2 * | 9/2004 | Haas et al. | 361/729 |
| 6,812,596 B2 * | 11/2004 | Veil | 307/326 |
| 6,839,242 B2 * | 1/2005 | Forinash et al. | 361/760 |
| 7,092,248 B2 * | 8/2006 | Shu | 361/683 |
| 7,184,272 B1 * | 2/2007 | Harlacher et al. | 361/729 |
| 7,185,500 B2 * | 3/2007 | Meir | 62/3.2 |
| 7,417,866 B1 * | 8/2008 | Beseth et al. | 361/732 |
| 2003/0039094 A1 * | 2/2003 | Sarkinen et al. | 361/681 |

* cited by examiner

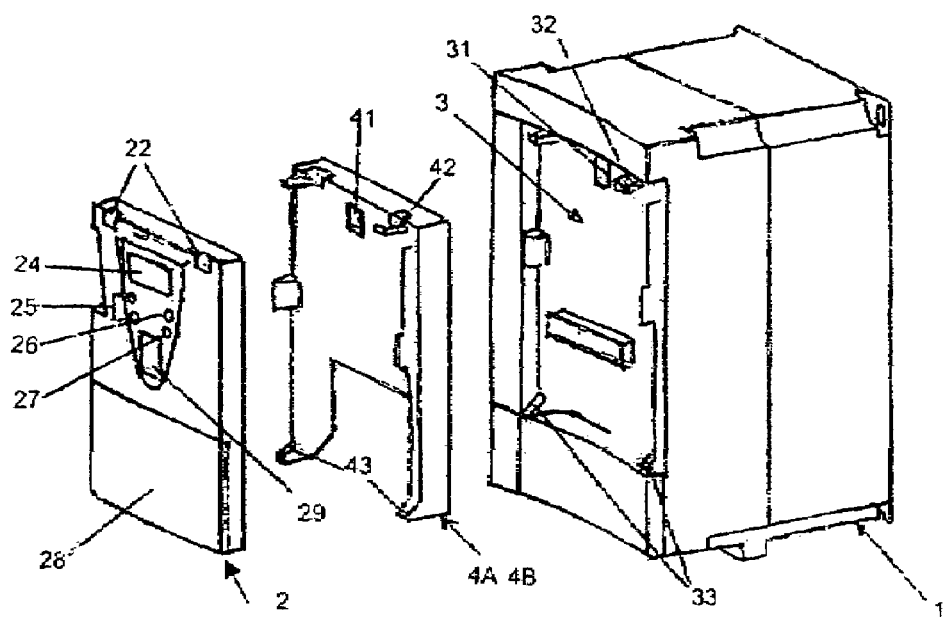
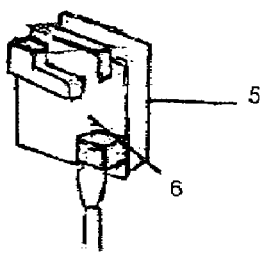
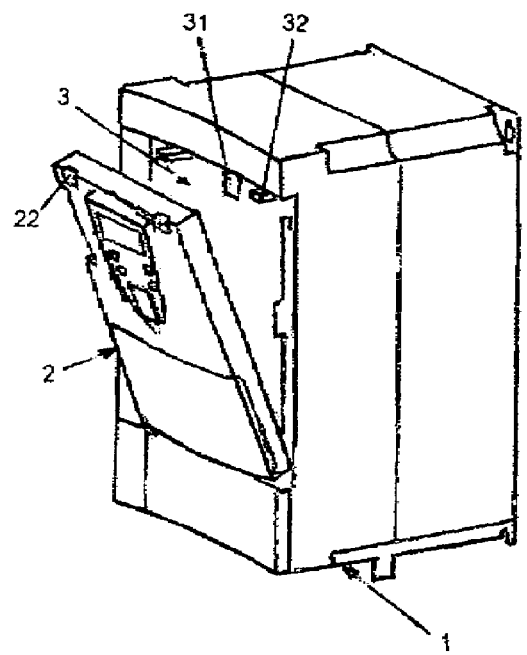
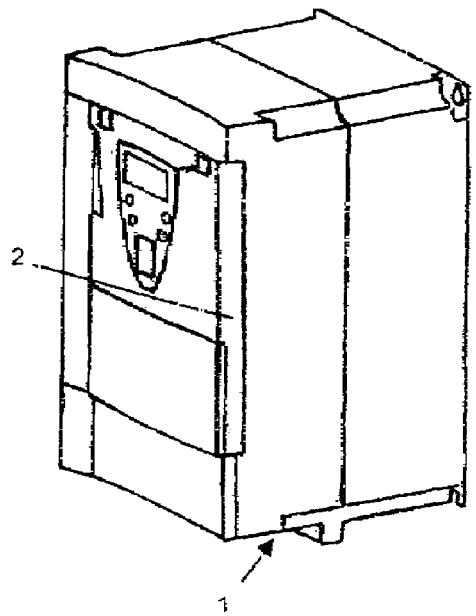
Fig. 2
Fig. 3
Fig. 4

| 7A | | 7C | 7C | 7C | States |
|---|---|---|---|---|---|
| | | 1 | 1 | 1 | Quiescent, options reset (inactive) |
| | | 1 | 1 | 0 | Option 4B recognized |
| | | 1 | 0 | 1 | Option 4A recognized |
| | | 1 | 0 | 0 | Options freed |
| | | No option | 4A present | 4B present | |

ELECTRONIC SPEED CONTROLLER WITH MODULAR LAYOUT

BACKGROUND OF THE INVENTION

1. Field of the Invention

The present invention pertains to an electronic speed controller with modular layout comprising, in a cabinet, an inverter delivering polyphase electric current and provided with static switches operated by an electronic control/command assembly linked to a display and dialogue module serving for control, command and for visualization, disposed on the front face.

2. Discussion of the Background

An electronic speed controller such as that shown diagrammatically in FIG. 1 makes it possible to feed an adjustable polyphase current to an asynchronous motor in such a way as to vary its speed. It comprises an inverter with electronic power switches which is supplied, under a filtered DC voltage, via a rectifier. This inverter delivers regulated AC current on the phases of the motor.

The technique of controlling electronic power switches is known by the name Pulse Width Modulation (PWM for short), the aim being to generate a voltage which is as close as possible to a sinusoid.

A display and dialogue assembly usable by the operator is situated on the front face. It generally exhibits a screen or visualization components, control buttons and at least one communication connector enabling the controller to be made to communicate with other automation apparatus.

Document EP 0660 652 discloses a controller of the above type. The compactness of such a controller is not optimized and does not allow the simultaneous incorporation of several optional cards.

SUMMARY OF THE INVENTION

An aim of the present invention is to provide an electronic speed controller exhibiting optimal compactness even if the number of optional cards varies. The cabinet of compact size contains the essential components while the optional cards, that are less common, are mounted on the front face in a stackable manner, behind the display and dialogue front face. As the number of options increases, the thicker is the front face. The electronics makes it possible to recognise the number of options and their positions.

The electronic speed controller according to the invention is characterized in that the cabinet exhibits, on the front face, a control panel provided with a control bus connector linked to the electronic control/command circuit disposed at the rear and able to support either the display and dialogue module connected up by a rear connector to the said front connector or to at least one option module provided with a through connector of which a rear part may be connected up to the front connector of the panel or of an option module and of which a front part may be connected to the rear connector of the display and dialogue module or of an adjacent option module so as to constitute a plurality of option modules connected in series and of variable thickness.

According to a characteristic, the option module comprises electronic means whereby the internal electronics of the controller may detect the option modules appended to the front of the control panel.

BRIEF DESCRIPTION OF THE DRAWINGS

Other characteristics and advantages will become apparent in the detailed description which follows, while referring to an embodiment given by way of example and represented by the appended drawings in which:

FIG. 2 is an exploded view of the controller, of an interposed option module and of the display and dialogue front module;

FIG. 3 is a view in which the removable display and dialogue module is in the mounting/dismounting position (without interposed option module);

FIG. 4 is a view in which the removable display and dialogue module is represented in the normal position of use (without interposed option module);

DETAILED DESCRIPTION OF THE DRAWINGS

Figure 1:
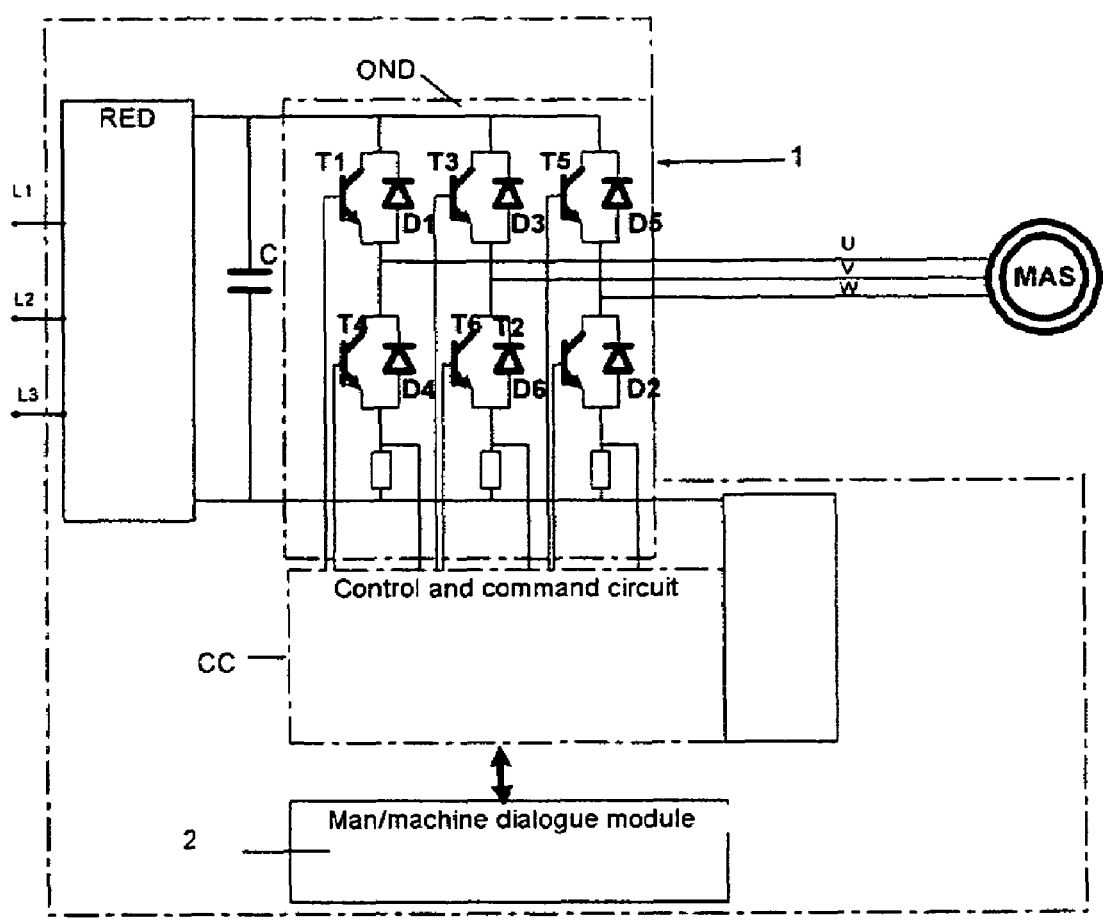
FIG. 1 is a functional diagram of the electronic controller.

The electronic controller according to the invention comprises, in a cabinet or box 1, a voltage inverter OND which receives the output voltage from a rectifier RED associated with a capacitive filter C and supplied via L1, L2, L3.

This voltage inverter is provided with electronic switches T1 to T6 associated with recovery diodes D1 to D6. Each arm of the inverter is equipped with two static power switches each associated with a recovery diode. The mid-points of the pairs of switches are connected to the phase lines U, V, W supplying the electric motor MAS. The electronic switches T1 to T6 are controlled by a control and command circuit CC in such a way as to deliver to the motor MAS, on the phase lines U, V, W, a pulse width modulated train (PWM).

The input terminals making the connection with the phase lines L1, L2, L3 as well as the terminals serving for the connection to the phases of the motor constitute a terminal block which is connected to a power card provided with various electronic switches and diodes. The power card is associated with a cooler and with fans serving to cool the electronic power switches.

The controller can be customized via a display and dialogue module 2 of graphical type which is connected to the command and control circuit CC. This display/dialogue module is intended to be housed on the front face of the cabinet or box 1 and comprises, at the front, a display 24, buttons 25 for scrolling through the menus or for modifying the values, a button 26 for outputting the menus and a submit button 27 for entering a menu or for submitting the new value chosen. It also exhibits a communication connector 29 making it possible to connect the controller to an automation network or to a dialogue or data processing station. At the rear is provided a control bus connector 21 the function of which will be explained hereinafter. At the top part it comprises locking members 22 and at the bottom part and at the rear fastening members.

Figures 5, 6:
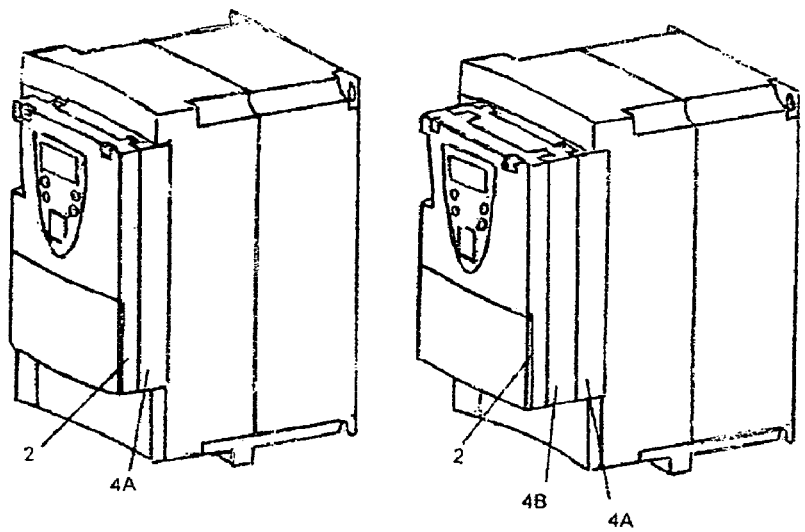
FIG. 5 is a view of the controller equipped with the display and dialogue module as well as with an interposed option module.
FIG. 6 is a view of the controller equipped with the removable display and dialogue module as well as with two interposed option modules.

The front face of the cabinet 1 is occupied by a control panel 3 which is slightly recessed with respect to this front face. At the top part this panel carries locking lugs 32 and at the bottom part it carries fixing lugs 33 which make it possible to removably fasten either a display and dialogue module 2 (FIGS. 3 and 4) or an option module 4A (FIGS. 5 and 6). These fixing lugs 33 cooperate with conjugate fixing means which are fashioned at the rear of the display/dialogue module 2 or of each option module 4. The locking lugs 32 cooperate with conjugate locking members of the display/dialogue module 2 or of each option module 4, respectively 22 and 42.

In the case where an option module 4A is mounted directly on the panel 3, the said module 4A can carry near the front either the display and dialogue module 2 (FIG. 5) or an additional option module 4B (FIG. 6) itself carrying the display/dialogue module 2.

The visible or front side of the control panel 3 exhibits a control bus connector 31 which is linked to the control circuit CC.

An add-on electronic module 6 protected by a removable support 5 and linking up via a connector to the front face of the panel can be fitted onto the panel 3. Such an add-on module can provide the link with a terminal or automaton.

A removable lid 28 fashioned on the display/dialogue module allows access to the add-on electronic module 6 and to the wiring connections.

Each add-on option module 4A, 4B which is housed between the control panel 3 and the display and dialogue module 2 exhibits near the rear a connector 41Ar that can be coupled up to the control connector 31 of the panel or 41Av of an adjacent module and near the front a connector 41Av that can be coupled up to the control connector 41Ar of an adjacent module or 21 of the display/dialogue module 2.

Figure 7:
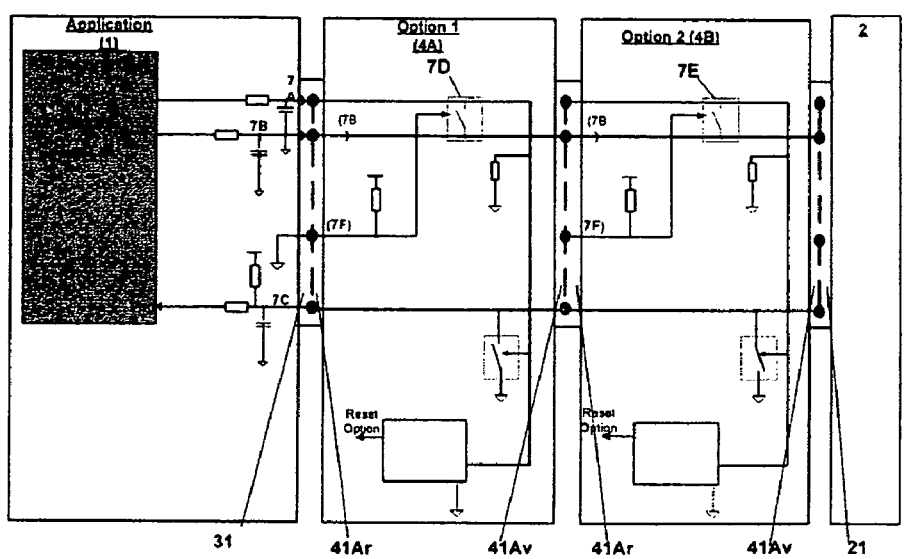
FIG. 7 is a diagram of the electronics and of the control bus making it possible to recognize the options used.

The circuit represented in FIG. 7 makes it possible to log via the control bus the number of option modules and their positions.

The circuit represented in FIG. 7 makes it possible to log via the control bus the number of option modules and their positions.

If the option module 4A is fitted, the link 7F opens the contact 7D. A positive pulse on the bus line 7A is detected on the line 7C by the microcontroller of the circuit CC.

Figure 8:
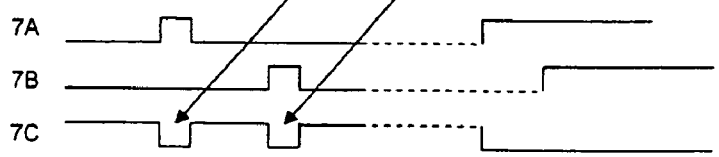
FIG. 8 is a truth table of the signals of the diagram of FIG. 7.

If the option module 4B is fitted, the contact 7E remains closed. A positive pulse on the line 7B is detected on the line 7C by the microcontroller of the circuit CC. The truth table and the timing diagram ci of FIG. 8 illustrate this case.

The signals 7A and 7B at 0 also have the function of disabling the microcontrollers of the option cards (signal_Reset at 0) and thus of being able to release them one after the other.

The principle makes it possible with option connectors that are mechanically identical to log the presence and the position of options. The type of option is thereafter recognized by the serial communications between the microcontroller (CC) and the options.

The bus comprises links and connection which are not represented in FIG. 7.

Of course, without departing from the scope of the invention, it is possible to conceive of other variants and refinements of detail and even to envisage the use of equivalent means.

The invention claimed is:

1. An electronic speed controller comprising:
   a cabinet including an inverter, static switches, and an electronic control/command assembly, wherein said static switches are included in said inverter and said electronic control/command assembly operates said static switches so that said inverter delivers an adjustable regulated polyphase AC current to be delivered to a load;
   a display and dialogue module;
   a control bus connector configured to link said display and dialogue module to the electronic control/command assembly so as to control said electronic control/command assembly based on inputs received with said display and dialogue module; and
   an add-on electronic module fitting between said display and dialogue module and a face of said cabinet,
   wherein said display and dialogue module has a removable lid configured to allow access to said add-on electronic module,
   wherein the control bus connector is configured to directly connect either to (i) the display and dialogue module or to (2) at least one option module including a through connector with a rear part directly connected to the control bus connector and a front part directly connected to either the display and dialogue module or a rear part of a through connector of another option module, and
   wherein a first option module is disposed between said control bus connector and said display and dialogue module, and wherein said first option module is shaped such that said add-on electronic module is accessible via said removable lid.

2. The electronic speed controller according to claim 1, wherein the at least one option module comprises means for detecting the another option module.

3. The electronic speed controller according to claim 1, wherein the cabinet is configured to support the one option module connected in series to the another option module, and
   the one option module and the another option module have variable thicknesses.

4. A speed controller according to claim 1, wherein said electronic control/command is configured to detect a presence of a plurality of option modules connected between said control bus connector and said display and dialogue module.

5. A speed controller according to claim 4, wherein said electronic control/command is configured to detect a relative position of said option modules connected between said control bus connector and said display and dialogue module.

6. A speed controller according to claim 5, wherein said option modules are connected to each other, to said control bus connector and to said display and dialogue module via mechanically identical connectors.

7. A speed controller according to claim 1, comprising a first option module disposed between said control bus connector and said display and dialogue module,
   wherein said first option module is directly connected to said control bus connector,
   wherein said display and dialogue module, said first option module and said control bus connector are connected in series,
   wherein said display and dialogue module transmits said inputs to said electronic control/command via said first option module, and
   wherein said first option module is able to directly connect either to said display and dialogue module or to a second option module between said first option module and said display and dialogue module.

8. A speed controller according to claim 7, comprising said second option module disposed between said control bus connector and said display and dialogue module,
   wherein said second option module is directly connected to said first potion module,
   wherein said display and dialogue module, said second option module, said first option module and said control bus connector are connected in series,
   wherein said display and dialogue module transmits said inputs to said electronic control/command via said first and second option modules, and wherein said second option module is able to directly connect either to said display and dialogue module or to a third option module.

9. A speed controller according to claim 8, comprising said third option module disposed between said control bus connector and said display and dialogue module,
- wherein said third option module is directly connected to said second potion module,
- wherein said display and dialogue module, said third option module, said second option module, said first option module and said control bus connector are connected in series,
- wherein said display and dialogue module transmits said inputs to said electronic control/command via said first, second and third option modules, and
- wherein said third option module is able to connect either to said display and dialogue module or to a fourth option module.

10. A speed controller according to claim 8, wherein said first and second option modules have different thicknesses from each other.

11. A speed controller according to claim 9, wherein said first, second and third option modules have different thicknesses from each other.

12. A speed controller according to claim 11, wherein said first, second and third option modules have mechanical connectors that are identical to each other.

13. A speed controller according to claim 9, wherein said electronic control/command is configured to detect a presence and relative position of said first, second and third option modules.

14. A speed controller according to claim 13, wherein said first, second and third option modules have mechanical connectors that are identical to each other and to mechanical connectors of said control bus connector and of said display and dialogue module.

15. A speed controller according to claim 1, wherein said electronic control/command assembly controls said static switches so as to deliver a pulse width modulation.

16. A speed controller according to claim 1, wherein said electronic control/command assembly controls said adjustable regulated polyphase AC current based on said inputs.

17. A speed controller according to claim 1, wherein a first option module is disposed between said control bus connector and said display and dialogue module, and wherein said first option module has a U-shaped recess that receives said add-on electronic module.

18. A speed controller according to claim 1, wherein said add-on electronic module provides a link to an external terminal or automaton.

19. A speed controller according to claim 1, wherein said display and dialogue module has a height that is shorter than said cabinet, wherein a first option module is disposed between said control bus connector and said display and dialogue module, and said first module has a height that is equal to that of said display and dialogue module.

20. A speed controller according to claim 1, wherein said electronic control/command is configured to detect a first pulse signal that identifies the presence of a first option module between said control bus connector and said display and dialogue module, said electronic control/command being further configured to detect a second pulse signal that identifies the presence of a second option module between said control bus connector and said display and dialogue module, and wherein said first and second pulse signals disable microprocessors of said first and second option modules.

* * * * *